(12) United States Patent
Peting

(10) Patent No.: US 12,362,731 B2
(45) Date of Patent: Jul. 15, 2025

(54) NOISE SHAPED DRIVE AND POPULATION BALANCED NETWORK

(71) Applicant: SKYWORKS SOLUTIONS, INC., Irvine, CA (US)

(72) Inventor: Mark R. Peting, Yamhill, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 3 days.

(21) Appl. No.: 18/378,439

(22) Filed: Oct. 10, 2023

(65) Prior Publication Data
US 2024/0137009 A1    Apr. 25, 2024

Related U.S. Application Data

(60) Provisional application No. 63/379,511, filed on Oct. 14, 2022, provisional application No. 63/379,510, filed on Oct. 14, 2022.

(51) Int. Cl.
H03M 1/74   (2006.01)
H03H 17/00  (2006.01)

(52) U.S. Cl.
CPC ............................. H03H 17/0045 (2013.01)

(58) Field of Classification Search
None
See application file for complete search history.

(56) References Cited

U.S. PATENT DOCUMENTS

| 9,484,947 B1 * | 11/2016 | Nguyen ................ H03M 1/002 |
| 11,757,466 B2 * | 9/2023 | Bandyopadhyay ..... H03M 3/39 375/286 |
| 2024/0137008 A1 | 4/2024 | Peting et al. |

OTHER PUBLICATIONS

Galton, "Why Dynamic-Element-Matching DACs Work," IEEE Transactions on Circuits and Systems, II: Express Briefs, vol. 57, No. 2, Feb. 2010, pp. 69-74.
Henderson et al., "Dynamic element matching techniques with arbitrary noise shaping function," Circuits and Systems, 1996. ISCAS '96, Connecting the World, 1996 IEEE International Symposium, vol. 1, May 12-15, 1996.
Jensen et al., "A low-complexity dynamic element matching technique for reduced-distortion digital-to-analog conversion," Circuits and Systems, 1999. ISCAS '99. Proceedings of the 1999 IEEE International Symposium, vol. 2, May 30-Jun. 2, 1999.

(Continued)

*Primary Examiner* — Jeffrey S Zweizig
(74) *Attorney, Agent, or Firm* — Lando & Anastasi, LLP

(57) ABSTRACT

This disclosure relates to a system for mitigating distortion in a signal, including a first calculation circuit configured to determine a bit-cell population available to be activated of a plurality of bit-cells based on a signal strength of an input signal, a second calculation circuit configured to determine a number of bit-cells to be activated based on the signal strength of the input signal, the number of bit-cells to be activated being less than or equal to the bit-cell population, a variable-width dynamic element matching network ("variable DEM") configured to activate a first subset of bit-cells of the bit-cell population based on the number of bit-cells to be activated, and one or more fixed-width dynamic element matching networks ("fixed DEMs") configured to activate a second subset of bit-cells of the bit-cell population based on the number of bit-cells to be activated.

20 Claims, 9 Drawing Sheets

(56) References Cited

OTHER PUBLICATIONS

Jensen et al., "A performance analysis of the partial randomization dynamic element matching DAC architecture," Circuits and Systems, 1997. ISCAS '97., Proceedings of 1997 IEEE International Symposium, vol. 1, Jun. 9-12, 1997.

Nys et al., "An analysis of dynamic element matching techniques in sigma-delta modulation," Circuits and Systems, 1996. ISCAS '96, Connecting the World, 1996 IEEE International Symposium, vol. 1, May 12-15, 1996.

Vesterbacka et al., "Dynamic element matching in D/A converters with restricted scrambling," Electronics, Circuits and Systems, 2000. ICECS 2000. The 7th IEEE International Conference, vol. 1, Dec. 17-20, 2000.

\* cited by examiner

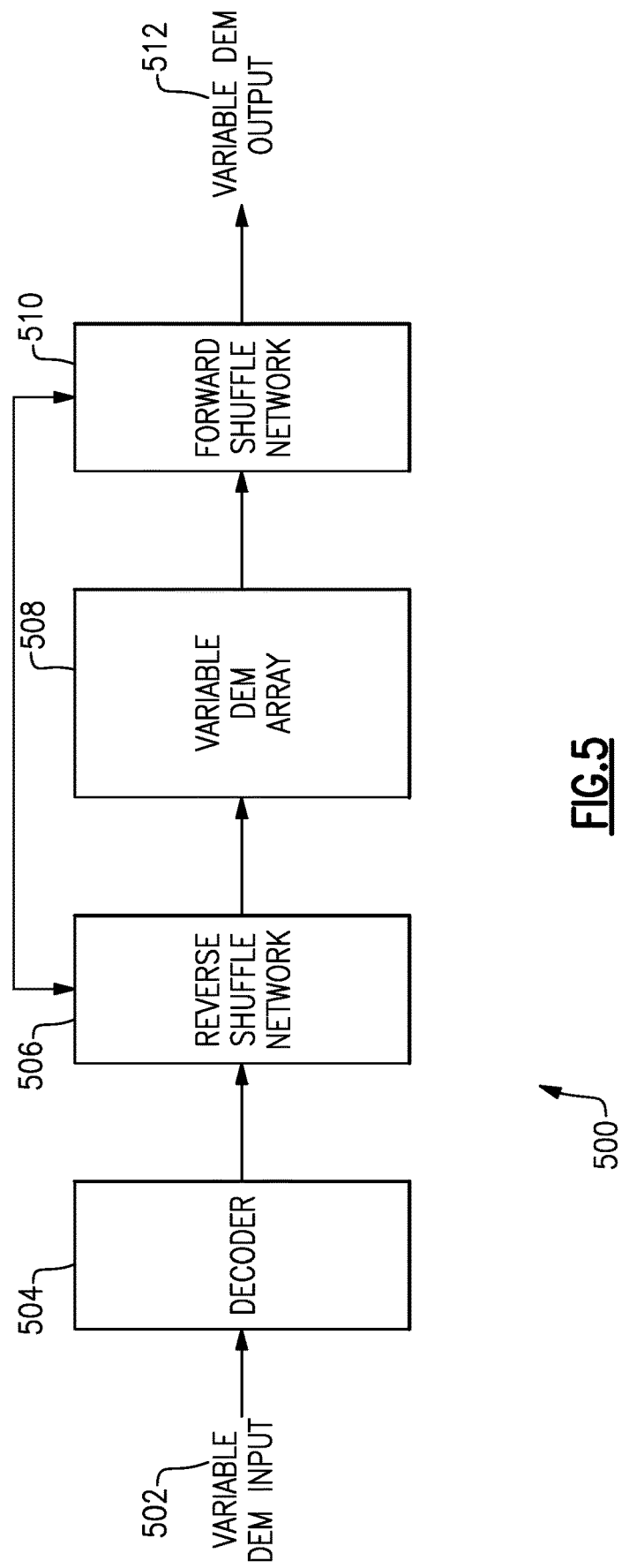

NOISE SHAPED DRIVE AND POPULATION BALANCED NETWORK

CROSS-REFERENCE TO RELATED APPLICATIONS

This application claims priority under 35 U.S.C. § 119 to U.S. Provisional Patent Application Number 63/379,511, titled NOISE SHAPED DRIVE AND POPULATION BALANCED NETWORK, filed on Oct. 14, 2022, which is incorporated by reference in its entirety for all purposes, and to U.S. Provisional Patent Application Number 63/379,510, titled CONTINUOUSLY VARIABLE DYNAMIC ELEMENT MATCHING NETWORK, filed on Oct. 14, 2022, which is incorporated by reference in its entirety for all purposes.

BACKGROUND

Signals, such as audio or electromagnetic signals, may be subject to distortion due to processes for converting said signals from analog to digital form, and vice versa. Distortion can cause undesirable effects, such as unwanted signal characteristics. In audio signal processing, for example, distortion can cause audible popping, clicking, and other sounds that may impact the listening experience.

SUMMARY

According to at least one aspect of the present disclosure, a system for mitigating distortion in a signal is provided. The system for mitigating distortion in a signal may comprise a first calculation circuit configured to determine a bit-cell population available to be activated of a plurality of bit-cells based on a signal strength of an input signal, a second calculation circuit configured to determine a number of bit-cells to be activated based on the signal strength of the input signal, the number of bit-cells to be activated being less than or equal to the bit-cell population, a variable-width dynamic element matching network ("variable DEM") configured to activate a first subset of bit-cells of the bit-cell population based on the number of bit-cells to be activated, and one or more fixed-width dynamic element matching networks ("fixed DEMs") configured to activate a second subset of bit-cells of the bit-cell population based on the number of bit-cells to be activated.

In some examples, the second calculation circuit determines a first number of bit-cells to be activated by the variable DEM and determines a second number of bit-cells to be activated by each of the one or more fixed Dems In various examples, the first subset of bit-cells is based on the first number of bit-cells and the second subset of bit-cells is based on the second number of bit-cells. In many examples, the first subset of bit-cells is activated on a first clock cycle and deactivated on a second clock cycle, and the second subset of bit-cells is activated on the first clock cycle and deactivated on the second clock cycle. In some examples, the first clock cycle is the clock cycle immediately preceding the second clock cycle. In various examples, the variable DEM activates a third subset of bit-cells on the second clock cycle, the third subset of bit-cells not including any bit-cells of the first subset of bit-cells.

In many examples, the one or more fixed DEMs activate a third subset of bit-cells on the second clock cycle, the third subset of bit-cells not including any bit-cells of the second subset of bit-cells. In some examples, the system further has a low population mode, a high population mode, and a barrel shifter, and in the low population mode, the barrel shifter is configured to select a subset of bit-cells to be activated based on the number of bit-cells to be activated, and the variable DEM and one or more fixed DEMs being deactivated, and in the high population mode, the barrel shifter is deactivated and the variable DEM and one or more fixed DEMs are activated.

In many examples, the variable DEM further comprising a first shuffle network, a variable array, and a second shuffle network, and the first shuffle network is configured to provide a subset of bit-cells to the variable array, the variable array is configured to provide bit-cells of the bit-cell population not including each bit-cell of the subset of bit-cells to the second shuffle network, and to provide a number of bit-cells to be activated by the variable DEM to the second shuffle network, and the second shuffle network is configured to randomly select the first subset of bit-cells from among bit-cells of the bit-cell population not including the subset of bit-cells. In some examples, the subset of bit-cells is comprised of bit-cells activated on a first clock cycle immediately preceding a second clock cycle on which the first subset of bit-cells is activated. In various examples, the one or more fixed DEMs further comprising at least one random extra control, at least one fixed barrel shifter, one or more offset arrays, and one or more butterfly networks, and the at least one fixed barrel shifter is configured to determine and activate a subset of the one or more fixed DEMs, the random extra control is configured to select one or more fixed DEM of the subset of fixed DEMs to activate an extra bit-cell based on the number of bit-cells to be activated, the offset array is configured to randomly select the second subset of bit-cells from among the bit-cells of the bit-cell population, and the butterfly network is configured to randomize the order of bit-cells selected for the second subset of bit-cells so as to reduce tone generated from bit-cell mismatches.

According to at least on aspect of the present disclosure, a method for mitigating distortion in a signal is provided. The method may comprise determining a bit-cell population available to be activated based on a signal strength of a signal, determining a total number of bit-cells to activate, the total number of bit-cells being less than or equal to the bit-cell population, responsive to determining the total number of bit-cells to activate, allocating a first portion of the total number of bit-cells, the first portion to be activated by a variable-width dynamic element matching network ("DEM"), responsive to determining the first portion, allocating a second portion of the total number of bit-cells, the second portion to be activated by one or more fixed-width DEMs, responsive to determining the first portion, randomly selecting a first subset of bit-cells to be activated by the variable-width DEM, responsive to determining the second portion, randomly selecting a second subset of bit-cells to be activated by the one or more fixed-width DEMs, the second subset not including any bit-cells of the first subset, and activating the first subset and second subset of bit-cells.

In some examples, bit-cells of the first subset and second subset are activated on a first clock cycle and deactivated on a second clock cycle. In various examples, the second clock cycle immediately follows the first clock cycle. In many examples, the method further comprises determining that the bit-cell population is below a threshold, responsive to determining that the bit-cell population is below the threshold, determining a subset of bit-cells to be activated by a barrel shifter, responsive to determining that the bit-cell population is below the threshold, deactivating the variable-width DEM and one or more fixed-width DEMs, and responsive to determining the subset of bit-cells to be activated by the barrel shifter, activating the subset of bit-cells. In some examples, the bit-cell population is determined periodically. In various examples, the bit-cell population is determined when the signal strength is at or near zero. In many examples, no bit-cell is activated for more than one clock cycle in a row.

According to at least one aspect of this disclosure, a non-transitory, computer-readable medium containing instructions configured to be executed by at least one processor, the instructions being configured to instruct the at least one processor to execute any of the methods discussed herein is provided.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 5 illustrates a variable-width dynamic element matching network according to a functional block diagram;

DETAILED DESCRIPTION

Figure 1:
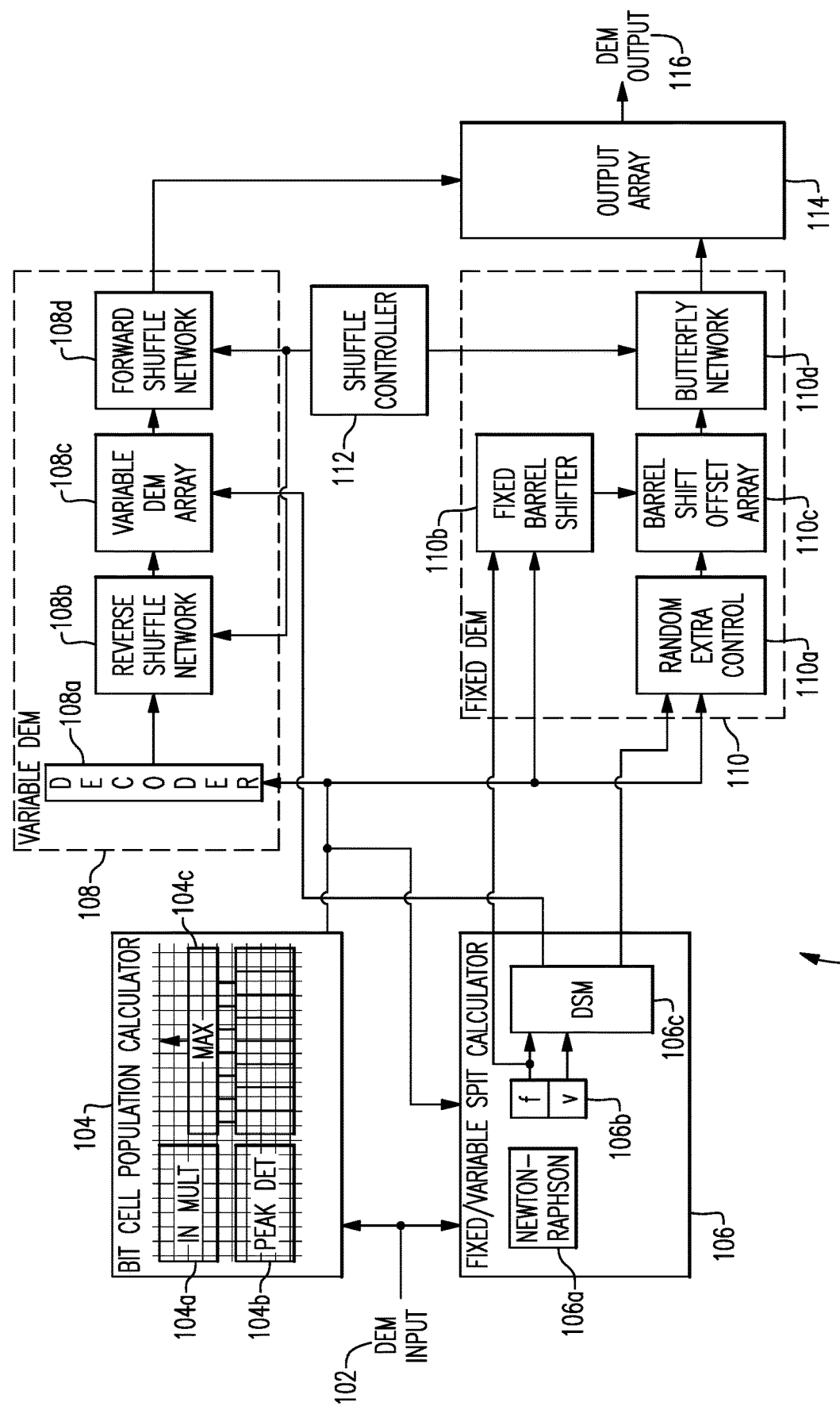
FIG. 1 illustrates a continuously variable dynamic element matching network according to a high-level functional block diagram.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. Acts, components, elements, and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

In some applications, Digital to Analog Converters (DACs) are used to convert digital signals to analog signals. For example, audio DACs are commonly used in audio applications to convert digital audio signals to analog audio signals, such as converting an MP3 file stored on a computer into an audible signal in a pair of headphones. DACs can use a bit-coded input that scales with the input signal, such as a "thermometer" input, to encode values associated with the digital audio signal in preparation for conversion of the digital audio signal to analog. The thermometer input may then control an array of bit-cells associated with or part of the DAC, causing certain cells to turn on and/or off, thus producing an output signal. However, traditional DAC processes can introduce an error into the output signal, producing off-tones and other undesirable artifacts based on the input signal. This type of error is commonly referred to as "distortion." The distortion introduced into the output signal will be proportional to the number of bit-cells turned on or off. Additionally, because the distortion depends on the input signal, every time a particular input signal is input into the DAC, the distortion associated with that particular input signal will be the same. Accordingly, there is a need in the art for a low distortion alternative to traditional DAC systems and methods.

Aspects and elements of the present disclosure include a DAC with reduced distortion. In some examples, the DAC takes a digital input signal and converts the digital input signal to an analog output signal using an array of bit-cells. A dynamic element matching network (DEM) selects which bit-cells of an array of bit-cells are used to drive the analog signal. To reduce signal error (e.g., distortion), the DEM implements a continuously variable bit population (CVBP) in the bit-cell array.

As mentioned, by using a DEM to select bit-cells of the DAC to activate, distortion in the output signal can be reduced. Distortion in some DACs may be caused by mismatches arising during production among circuit elements, such as nominally identical bit-cells. The mismatches among nominally identical circuit components cause non-linear distortion in the output signals generated by the DAC. For example, nominally identical amplifier circuit components may have different levels of gain at a particular voltage level due to the fabrication process. One method by which DEMs correct the distortion created by component mismatches is by randomly selecting circuit components (bit-cells) to use, such that the distortion becomes pseudorandom noise, and thus can be treated as a form of white noise, and filtered out of the output signal. It may be appreciated that this process, in broad terms, converts one type of error (distortion) into another type of error (noise). It will be appreciated that distortion is a form of substantially non-random error, while noise is a form of random or pseudo-random error.

One example of a DEM DAC disclosed herein uses a single DEM with a variable bit-width (a "variable DEM") to randomly select bit-cells to activate. The total bit-width of the variable DEM equals the total number of bit-cells of the DAC. In this case, the variable DEM is the only DEM selecting which bit-cells to activate and the variable DEM controls each and every bit-cell. One example of such a variable DEM is discussed with respect to FIG. 5. Such a variable DEM may also be implemented using a pair of Benes shuffle networks (a forward Benes shuffle network and inverse (or reverse) Benes shuffle network, the inverse Benes shuffle network carrying out the inverse transformation of the transformation carried out by the forward Benes shuffle network), an input, and a barrel shifter. The single variable DEM can then activate any arbitrary number of bit-cells of the DAC. However, the variable DEM discussed in this paragraph requires a considerable amount of logic gates, which may be disadvantageous despite the DEM's advantageous ability to activate any arbitrary number of bit-cells.

A second example of a DEM DAC disclosed herein uses a single variable DEM with a smaller overall bit-width. The variable DEM is combined with one or more fixed-width DEMs to create a "telescoping" DEM topology which allows arbitrary numbers of bit-cells to be turned on and off, while also using considerably fewer gates than the preceding example of a single variable DEM. While only a single variable DEM is required when combined with fixed-width DEMs, multiple variable DEMs could be used if desired.

For clarity, the single variable DEM DAC topology will be referred to as the fully variable DEM herein, and the mixed variable/fixed-width DEM DAC topology will be referred to as the telescoping DEM herein. In other cases, the DEM may be referred to simply as the DEM, such as when describing the general functionality of the DEM, such as in those cases where the operation of the DEM (or DEMs) may apply to both topologies.

The DEM may control the number of bit-cells which are available for use. For clarity, the number of bit-cells available for use shall be referred to as the "bit-cell population." In some examples, the bit-cell population is determined based on the digital input signal level and timing. For example, the bit-cell population may range between a minimum and maximum limit, both limits being based on a multiple of the level of the input signal. In various examples, the bit-cell population may increase or decrease during a zero crossing, the zero crossing being, for example, when a peak detector detects a zero and/or near zero value. Increasing or decreasing the bit-cell population at zero crossings may be advantageous because the input signal will be at or near zero during such crossings. As a result, any distortion may be proportional to the near zero value of the input. Put another way, if the input has an amplitude of zero, any distortion multiplied by zero is still zero. In this way, distortion and other undesirable audio artifacts may be minimized. In some examples, the bit-cell population may increase or decrease slowly in the absence of a zero crossing, such as in the case of an application that needs to allow decreases even with a DC signal. By slowly increasing or decreasing the bit-cell population, distortion may be minimized because slow changes to the bit-cell population prevent large numbers of bit-cells from being activated or deactivated at once. Activating or deactivating large numbers of bit-cells at once might introduce substantial error since doing so can increase the total amplitude of the output signal (when activating a large number at once) or abruptly reduce the total amplitude of the output signal (when deactivating a large number at once), thus potentially introducing distortion into the output signal.

The DEM may control which bit-cells are active from among the bit-cell population. An active bit-cell is a bit-cell that is on, for example, a bit-cell that is driving the analog output signal. In some examples, the DEM may enable the exact number of bit-cells requested by a DEM input. In various examples, enabling the bit-cells requested by the DEM input may enable valid delta-sigma modulation (DSM) behavior of the system. The DEM may be configured such that each enabled bit-cell is used evenly. In some examples, the DEM may use bit-cells evenly by enabling one or more bit-cells for a single clock cycle, and then deactivating the enabled bit-cells for one or more clock cycles. The DEM may enable each bit-cell of the bit-cell population an equal number of times during a given period of operation, thus ensuring that each bit-cell is activated the same amount as any other bit-cell. In some examples, the DEM may shuffle the order of use of bit-cells of the bit-cell population, for example by using a shuffler component or a shifting component such as a barrel shifter.

For clarity, the distinction between the total number of bit-cells, the bit-cell population, active and inactive bit-cells, and enabled bit-cells should be fully understood. Each of these terms refers to something slightly different. The total number of bit-cells means every bit-cell in the DAC, regardless of its status. The bit-cell population means the bit-cells in the DAC that may (or are available) be activated. The active bit-cells means bit-cells that are turned on (or that will be turned on), and therefore produce or contribute to an output signal. The inactive bit-cells means bit-cells that are not active but that could be activated. Therefore, the sum of the total number of active and inactive bit-cells equals the bit-cell population. The bit-cell population may be equal to or less than the total number of bit-cells. Finally, at times, bit cells may be referred to as enabled bit-cells. Enabled bit-cells are bit-cells belonging to the bit-cell population, but not necessarily active. In general, enabled bit-cells are the share of the bit-cell population allocated to a given fixed or variable-width DEM. Thus, the sum of the enabled bit-cells across each DEM equals the bit-cell population, whereas the total number of active bit-cells may be less than or equal to the bit-cell population and/or the enabled bit-cells.

In some examples, the DEM—for example the telescoping DEM—may include more than one "sub-DEM." That is, a DEM may include multiple constituent DEMs, for example, one variable width DEM and multiple fixed width DEMs.

Turning to the drawings, FIG. 1 illustrates a CVBP DEM 100 according to a high-level functional block diagram. The illustrated CVBP DEM 100 is an example of a CVBP DEM suitable for use as a telescoping DEM. The CVBP DEM 100 includes a DEM input 102, a bit cell population calculator (BCPC) 104, a fixed/variable split calculator (FVSC) 106, a variable DEM 108 (sometimes referred to as a variable-width DEM), a fixed DEM 110 (sometimes referred to as a fixed-width DEM), a shuffle controller 112, an output array 114, and a DEM output 116. In some examples, more than one fixed DEM 110 may be included.

The BCPC 104 includes an incrementor 104a, a peak detector 104b, and a bit-cell population register 104c (referred herein as a "population register"). The FVSC 106 includes a Newton-Raphson reciprocator 106a, fixed and variable delta-sigma modulator (DSM) inputs 106b, and a delta-sigma modulator (DSM) 106c. The variable DEM 108 includes a decoder 108a, a reverse shuffle network 108b, a variable DEM array 108c, and a forward shuffle network 108d. The fixed DEM 110 includes a random extra control 110a, a fixed barrel shifter 110b, a barrel shift offset array 110c, and a butterfly network 110d.

The DEM input 102 is coupled to the BCPC 104 and to the FVSC 106. The BCPC 104 is coupled to variable DEM 108, the fixed DEM 110, and the FVSC 106. More particularly, in some examples, the BCPC 104 is coupled to the decoder 108a of the variable DEM 108, and to the fixed barrel shifter 110b and random extra control 110a of the fixed DEM 110, as well as to the FVSC 106. Certain additional details and internal aspects of the BCPC 104 will be discussed below, with respect to FIG. 2. The FVSC 106 is coupled to the BCPC 104, the variable DEM 108, and the fixed DEM 110. More particularly, in some examples, the fixed/variable DSM inputs are coupled to the fixed barrel shifter 110b, and the DSM 106c is coupled to the variable DEM array 108c and to the random extra control 110a. With respect to the BCPC 104 and the FVSC 106, in some examples the internal components of those devices are coupled to one-another. That is, for example, the internal components of the BCPC 104 (e.g., the incrementor 104a, peak detector 104b, and population register 104v) may all be coupled to each other.

The variable DEM 108 is coupled to the BCPC 104, the FVSC 106, the fixed DEM 110, the shuffle controller 112, and the output array 114. More particularly, in some examples, the decoder 108a is coupled to the BCPC 104, the FVSC 106, the fixed barrel shifter 110b, and the random extra control 110a. The variable DEM array 108c may be coupled to the DSM 106c. The forward shuffle network 108d may be coupled to the shuffle controller 112 and to the output array 114. The fixed DEM 110 is coupled to the BCPC 104, the FVSC 106, the variable DEM 108, the shuffle controller 112, and the output array 114. More particularly, in some examples, the random extra control 110a may be coupled to the BCPC 104, the FVSC 106, the fixed barrel shifter 110b, and the decoder 108a. The fixed barrel shifter 110b may be coupled to the random extra control 110a, the fixed/variable DSM inputs 106c, the BCPC 104, and the decoder 108a. The butterfly network 110d may be coupled to the shuffle controller 112 and the output array 114. In some examples, the butterfly network 110d may be coupled to the output array 114 in more than one place, such as the highest address element and the lowest address element of the output array 114.

The shuffle controller 112 is coupled to the variable DEM 108 and the fixed DEM 110. More particularly, in some examples, the shuffle controller 112 may be coupled to the forward shuffle network 108d and to the butterfly network 110d. The output array 114 is coupled to the variable DEM 108 and the fixed DEM 110. More particularly, in some examples, the output array 114 is coupled to the forward shuffle network 108d and to the butterfly network 110d.

Within the variable DEM 108, the decoder 108a is coupled to the reverse shuffle network 108b. The reverse shuffle network 108b is coupled to the variable DEM array 108c, and the variable DEM array 108c is coupled to the forward shuffle network 108d. In some examples, the reverse shuffle network 108b and the forward shuffle network 108d may be coupled to one another.

Within the fixed DEM 110, the random extra control 110a may be coupled to the barrel shift offset array 110c. In some examples, the random extra control 110a may be coupled to the barrel shift offset array 110c in more than one location, such as the highest address element of the array and the lowest address element of the barrel shift output array 110c. The fixed barrel shifter 110b may be coupled to the barrel shift offset array 110c. In some examples, the fixed barrel shifter 110b may be coupled to the barrel shift offset array 110c in such a way as to allow the fixed barrel shifter 110b to provide the barrel shift offset array 110c with two inputs, for example a "long" input and a "short" input, the "long" input having a larger width than the "short" input. The barrel shift offset array 110c may be coupled to the random extra control 110a, the fixed barrel shifter 110b, and the butterfly network 110d. In some examples, the barrel shift offset array 110c may be coupled to the butterfly network 110d in more than one location, such as at the highest address element and lowest address element of the butterfly network 110d.

The CVBP DEM 100 may operate in many modes of operation including a large population mode and a small population mode. These two modes operate differently from one another. Specifically, in the small population mode certain circuit elements are disabled (or ignored). The small population mode will be discussed with respect to FIG. 8. The following discussion, with respect to FIG. 1, applies primarily to the large population mode.

The DEM input 102 receives a digital input signal which may be, for instance, a thermometer encoded input corresponding to the digital representation of an audio signal. The signal may be provided by any external circuit, for example, a DSM circuit. However, any type of digital signal may be received, and the invention is not limited to audio signals or thermometer encoded signals. The input 102 may provide the digital input signal to the BCPC 104 and/or to the FVSC 106.

The BCPC 104 calculates the active bit-cell population. In some examples, the BCPC 104 determines the maximum number of active bit-cells and stores the maximum number of active bit-cells in the population register 104c. The maximum possible value for the population register 104c may be any value, but in some examples the maximum possible value will be equal to one-half of the total number of bit-cells. In examples where the maximum bit-cell population is one-half the total number of bit-cells, limiting the maximum bit-cell population to half the total number of bit cells allows the DEM to select between the active half of the bit-cells and the inactive half of the bit-cells every clock cycle, thus ensuring that all the bit-cells are used evenly over time.

In some examples, the BCPC 104 may recalculate the bit-cell population and store the recalculated value in the bit-cell population register 104c. For example, the BCPC 104 may be configured to detect zero crossings of the digital input signal and then may increase or decrease the value in the population register 104c by a multiple of the peak value detected by the peak detector 104b of the digital input signal over a windowed peak period of digital input signal samples. In some cases, the incrementation and decrementation of the bit-cell population may be carried out by the incrementor 104a. In some examples, the incrementation and decrementation coefficients may be multiples of the peak value of the DSM 106c inputs. In some examples, the population register 104c value is incremented upwards during a zero crossing when the bit-cell population register 104c value is smaller than the peak value detected by the peak detector 104b times an incrementation coefficient of the incrementor 104a. In some examples, the bit-cell population 104c value is decremented downwards during a zero crossing when the bit-cell population register 104c value is greater than the peak value detected by the peak detector 104b multiplied by a decrementation coefficient of the incrementor 104a. In some examples, the value stored in the bit-cell population register 104c may also be incremented or decremented during a non-zero crossing if the value is less than the peak detected by the peak detector 104b.

The FVSC 106 calculates the number of active bit-cells for the variable DEM 108 and the fixed DEM 110. In some examples, there may be more than one fixed DEM 110 (e.g., 2, 3, 5, 10, or more) and the FVSC 106 may calculate the number of active bit-cells for each fixed DEM 110. The Newton-Raphson Reciprocator 106a calculates a reciprocal value, for example the reciprocal of the bit-cell population, using Newton-Raphson Reciprocation. It will be appreciated that any method of calculating a reciprocal could be used, such as any circuit capable of performing division. However, the Newton-Raphson Reciprocator 106a has mostly static logic and low power consumption because the value of the bit-cell population changes relatively slowly. Thus, the Newton-Raphson Reciprocator 106a offers advantages of less power usage and less time intensive division. Once the reciprocal is calculated, it is multiplied by the value of the digital input signal, and the resulting product is used to determine the number of active bit-cells for the variable DEM 108. Once the number of active bit-cells for the variable DEM 108 is determined, the FVSC 106 calculates the number of active bit-cells for each fixed DEM 110. The FVSC 106 is further configured to ensure that the value of active bit-cells for the variable DEM 108 averages approximately ½ too low over long periods of time. The values of active bit-cells for the variable DEM 108 and fixed DEM 110 are used as inputs to the DSM 106c from the DSM inputs 106b. It will be appreciated that, in some cases and/or examples, the values of active bit-cells may not be integers. The DSM 106c is configured to account for this by taking any fractional inputs and correcting them in such a way that the average value of active bit-cells for both variable and fixed DEMs 108, 110 averages out to be ideal or close to ideal over time. The FVSC 106 then provides the number of active bit-cells to the variable DEM 108 and the fixed DEMs 110. An example of an FVSC 106, and additional details about FVSCs are discussed with respect to FIG. 3.

The variable DEM 108 controls which bit-cells will be activated from among the bit-cell population allocated to the variable DEM 108. The variable DEM 108 then provides a drive signal to the output array 114 indicating which bit-cells should be driven (that is, which bit-cells should be activated and therefore outputting a signal). The variable DEM 108 is configured to ensure that the bit-cells are activated evenly, for example by ensuring that each bit-cell is active for no more than a single clock cycle before being deactivated. The variable DEM 108 will be discussed in greater detail with respect to FIG. 5.

The fixed DEM 110 controls which bit-cells will be activated from among the bit-cell population allocated to the fixed DEM 110. The fixed DEM 110 provides a drive signal to the output array 114 indicating which bit-cells should be driven (that is, which bit-cells should be activated and therefore outputting a signal). The fixed DEM 110 is configured to ensure that the bit-cells are activated evenly, for example by ensuring that each bit-cell is active for no more than a single clock cycle before being deactivated. The fixed barrel shifter 108b receives at least two input signals. One of the at least two input signals is received from the FVSC 106 and indicates the number of bit-cells to be activated per fixed DEM 110, as in those cases where more than one fixed DEM 110 is present in the circuit. Another of the at least two input signals is received from the BCPC 104, and may be indicative of the bit-cell population. The fixed barrel shifter 110b may then determine the number of fixed DEMs 110 to activate such that a sufficient number of fixed DEMs 110 are providing output to the output array 114 to activate the determined number of bit-cells of the bit-cell population. The random extra control 110a assigns an additional bit-cell to be activated to some of the fixed DEMs 110 to ensure that, in the case where the number of activated bit-cells is not a multiple of the number of activated variable DEM 108 and fixed DEM 110 bit-cells, that the difference may be made up by one or more of the fixed DEMs 110. The random extra control 110a is further configured to guarantee that the extra bit-cells are evenly distributed across the available fixed DEMs 110.

It will be appreciated that the random extra control 110a and the fixed barrel shifter 110b need not be implemented in each fixed DEM 110. For example, a single random extra control 110a and/or a single fixed barrel shifter 110b could be implemented separately from the fixed DEM 110. In such example, the fixed DEM 110 would include the barrel shift offset array 110c and the butterfly network 110d. In examples where the random extra control 110a and the fixed barrel shifter 110b are not part of the fixed DEMs 110, and there are multiple fixed DEMs 110, then each fixed DEM 110 may still have its own respective barrel shift offset array 110c and butterfly network 110d. In such examples, the random extra control 11a and fixed barrel shifter 110b are common to each fixed DEM 110.

The barrel shift offset array 110c shuffles the bit-cells to be activated by the fixed DEM 110. In some examples, the barrel shift offset array 110c is configured to receive the last state of activated bit-cells (that is, the bit-cells activated in a previous clock cycle), and then activate new bit-cells while ensuring the previously activated bit-cells are not activated for more than a single clock cycle. The butterfly network 110d may be configured to periodically change such that any tones from periodic cycling of the barrel shift offset array 110c are broken up and/or removed, or shifted to a frequency that allows the tones from periodic cycling to be filtered and removed from the output audio signal. Furthermore, in examples where there are multiple fixed DEMs 110, each respective butterfly network 110d may have a unique randomization.

The fixed DEM 110 will be discussed in greater detail with respect to FIG. 6.

The shuffle controller 112 is configured to control the shuffle patterns and/or randomization of the forward shuffle network 108d, reverse shuffle network 108b, and butterfly network 110d. In some examples, the shuffle controller 112 may provide a signal to any of the forward shuffle network 108d, reverse shuffle network 108b, and butterfly network 110d indicating how those networks are to shuffle inputs they receive. In some examples, the forward and reverse shuffle networks 108d, 108b receive the same signal from the shuffle controller 112, so that the reverse shuffle network 108b is able to perform the inverse transformation on the output signals of the forward shuffle network 108d.

In some examples, the shuffle controller 112 may be configured to follow certain rules such that the randomization patterns/instructions it provides do not change constantly, such that fairness among bit-cells is maintained, and/or such that tones resulting from bit-cell mismatches are avoided.

The output array 114 is configured to receive inputs from the fixed and variable DEMs 110, 108 and to provide a signal to the DEM output 116 indicative of which bit-cells to activate (i.e., which bit-cells to produce outputs) so that an audio signal can be generated without distortion.

Where elements of arrays or networks are discussed, it will be appreciated that these elements may be individual registers having predetermined or known addresses associated with them. In each of the foregoing couplings, the coupling may be made in any manner, for example, via busses, wireless transmission, and so forth.

Figure 2:
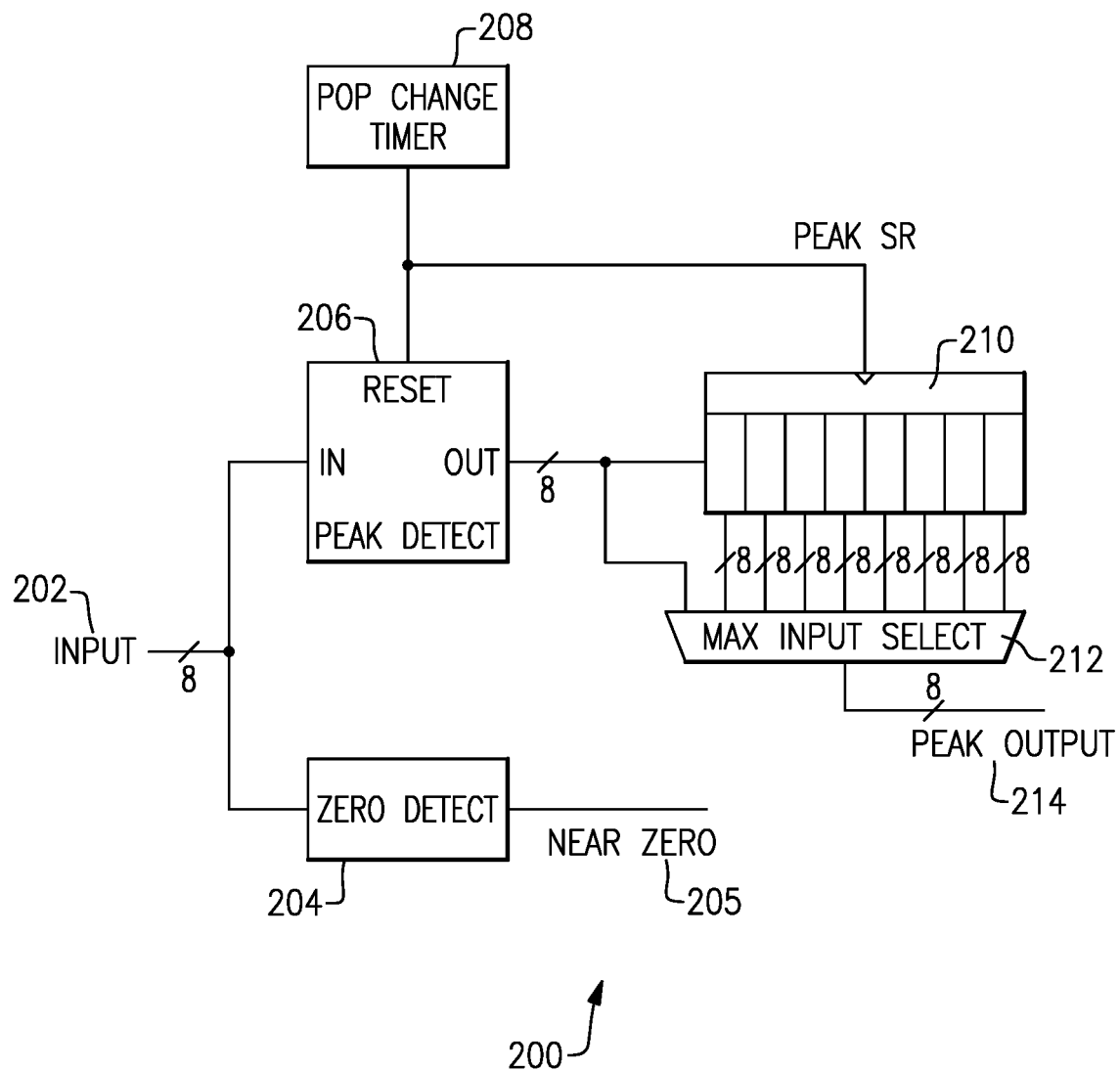
FIG. 2 illustrates a block diagram of a windowed peak detector and bit-cell population register according to a functional block diagram.

FIG. 2 illustrates a block diagram of a windowed peak detector and bit-cell population register (referred to herein as "windowed peak detector") 200 according to an example. The windowed peak detector 200 is an example of a peak detector, zero detector, and population register suitable for use in the BCPC 104 of FIG. 1. For example, the windowed peak detector 200 serves as one possible implementation of the peak detector 104b and the population register 104c. The windowed peak detector may be configured, in some examples, to only provide outputs during a windowed peak detection period. A windowed peak detection period is a period of time during which the windowed peak detector 200 is configured to determine whether a zero crossing has occurred and/or whether the bit-cell population should change.

The windowed peak detector 200 includes an input 202, a zero detector 204, a near zero output 205, a peak register 206, a population change timer 208, a multi-stage shift register (MSSR) 210, a multiplexer (MUX) 212 and a peak output 214. The input 202 is coupled to the zero detector 204 and the peak register 206. The zero detector 204 is coupled to the near zero output 205. The peak register 206 is coupled to the population change timer 208, the MSSR 210, and the MUX 212. The pop change timer 208 is coupled to the peak register 206 and the MSSR 210. The MSSR 210 is coupled to the peak register 206, the population change timer 208, and the MUX 212. The MUX 212 is coupled to the peak register 206, the MSSR 210, and the peak output 214. The peak output 214 is coupled to the MUX 212.

The input 202 receives an input signal, for example a DSM signal such as the DEM input 102 or the output of DSM 106c in FIG. 1. The input 202 provides the input signal to the zero detector 204, which may provide an output to the zero output 205 when the input signal value is at or near zero. For example, the zero detector 204 may compare the input signal value against a low value such as 3 or 0, and may output a signal to the zero output 205 if the input signal value is less than and/or equal to the low value. The value the zero detector 204 compares against to determine if a value is sufficiently close to zero may be programmed and/or set by a user, for example, an end-user or another part of the circuit. The zero detector 204 may also output a signal to the zero output 205 if a polarity, for example, the sign, of the input signal changes. In some examples, the zero detector 204 indicates that a zero crossing has occurred by providing an output signal to the zero output 205. In some examples, the zero detector 204 may only detect zero crossings during the windowed peak detection period.

The input 202 also provides the input signal to the peak register 206. The peak register 206 receives and stores the value of the input signal received at the input 202, and can provide the stored input signal value to the MSSR 210 and to the MUX 212. The population change timer 208 provides a clock signal to the MSSR 210 and a reset signal to the peak register 206. The population change timer 208 acts as a timer corresponding to the windowed peak detection period during which the peak detector 200 determines the windowed peak value of the DSM. That is, the population changer timer 208 may be configured to determine when the windowed peak detection period occurs. To determine the windowed peak value of the input signal, during the windowed peak detection period, the peak register 206 receives and stores input signal values, and provides those values to the MSSR 210. The MUX 212 receives the input signal values stored in the MSSR 210 and peak register 206, and outputs the maximum input signal value from among the values received from the MSSR 210 and peak register 206 to the peak output 214.

In some examples, when the windowed peak detector's 200 zero detector 204 provides an output to the zero output 205, the MUX 212 provides the maximum digital input signal value to the peak output 214. In examples where the windowed peak detector 200 is part of the BCPC 104 of the CVBP DEM 100, the CVBP DEM 100 may then use the maximum digital input signal value to adjust the bit-cell population. For example, the CVBP DEM 100 may be configured to operate in various modes. Such modes may include a zero-decrement mode and a zero-update mode. The zero-decrement mode may correspond to the CVBP DEM 100 decreasing the number of active bit-cells by the maximum digital input signal value multiplied by a decrementation coefficient during a detected zero crossing. In zero-decrement mode the bit-cell population can increase by an incrementation coefficient multiplied by the peak value of the digital input signal at any time. In the zero-update mode, the bit-cell population may be adjusted up or down at a zero crossing. For example, the bit-cell population may be adjusted down if larger than a decrementation coefficient multiplied by the windowed peak value, or adjusted up if the bit-cell population is less than an incrementation coefficient multiplied by the digital input signal value.

The windowed peak detector 200 may also be configured to include a timer value that can cause the bit-cell population to change even without detecting a zero crossing. For example, for a given time period, the timer value may decrease. When the timer value reaches zero the bit-cell population is decremented by some amount which may be set (e.g., 1, 4, etc.) or variable. In some examples, when decreasing the bit-cell population in this way, the change in the bit-cell population may be relatively small, thus minimizing any distortion or other audio artifacts which may occur. It will be appreciated that, since the distortion is proportional to the change in the number of bit-cells, by keeping the change low the distortion may be minimized.

The windowed peak detector 200 may also include circuitry designed to determine the operation mode of the CVBP DEM 100. In some examples, the bit-cell population value is compared to a value stored in a large/small mode register. If the bit-cell population value is less than and/or less than or equal to the value stored in the large/small mode register, the windowed peak detector 200 may control the CVBP DEM 100 to operate in the small population mode of operation. If the bit-cell population value is greater than and/or greater than or equal to the value stored in the large/small mode register, the windowed peak detector 200 may control the CVBP DEM 100 to operate in the large population mode of operation. The large and small modes of operation will be discussed in greater detail with respect to FIG. 8.

Figure 3:
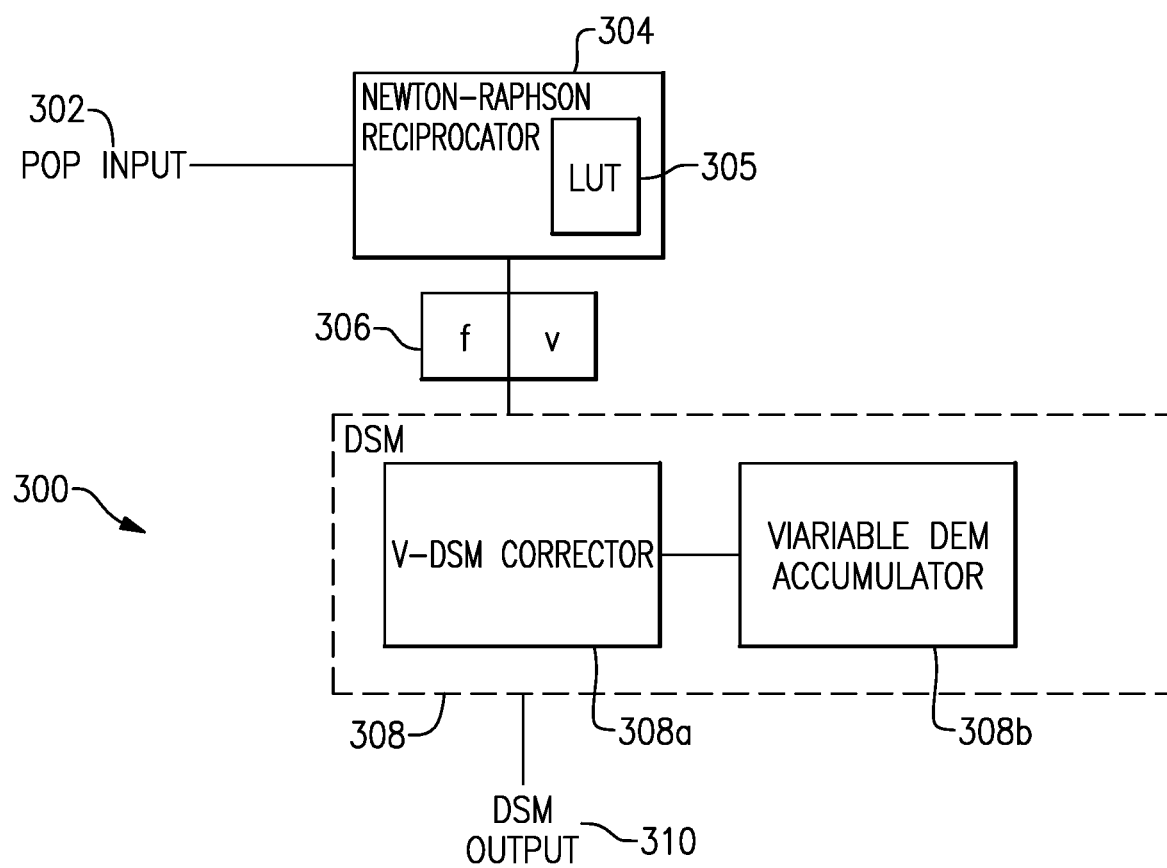
FIG. 3 illustrates a fixed/variable split calculator according to a functional block diagram.

FIG. 3 illustrates a fixed/variable split calculator (FVSC) 300 according to an example. The FVSC 300 is an example of a fixed/variable split calculator suitable for use as the FVSC 106 of FIG. 1. The FVSC 300 is configured to calculate the number of active bit-cells, v, of the variable DEM (e.g., variable DEM 108) and to calculate the number of active bit-cells, f, for each of the one or more fixed DEMs (e.g., fixed DEMs 110). Hereafter, reference will be made to the variable DEM 108 and fixed DEMs 110 for clarity. The fixed DEMs 110 and variable DEM 108 use the values off and v, respectively, to determine how many bit-cells to activate.

The FVSC 300 includes a population input 302, a Newton-Raphson reciprocator 304, a DSM input 306, a DSM 308, and a DSM output 310. The Newton-Raphson reciprocator 304 may include various Look-up Tables (LUTs) 305. The DSM 308 may include a variable DSM (V-DSM)) corrector 308a and a variable DSM (V-DEM) accumulator 308b. The population input 302 is coupled to the Newton-Raphson Reciprocator 304. The DSM input 306 is coupled to the DSM 308. In some examples, DSM input 306 may be coupled to the DSM 308 in more than one place, for example, with a coupling corresponding to an input for the value f, and another for the value v. The V-DSM corrector 308a and the V-DEM accumulator 308b may be coupled to each other. The DSM output 310 is coupled to the DSM 308.

The FVSC 300 calculates the values off and v such that the number of active bit-cells may be evenly distributed across the various DEMs over time. To determine the values off and v, the FVSC 300 may determine a reciprocal value, 1/P, where P is the bit-cell population (such as the bit-cell population determined by the BCBP 104). The Newton-Raphson reciprocator 304 may determine the value of 1/P. For example, the Newton-Raphson reciprocator 304 may receive the value of P via the population input 302, where the value of P corresponds to the bit-cell population. Then, through logic and/or by using the LUTs 307, the Newton-Raphson reciprocator 304 may determine a value or approximate value for 1/P. The Newton-Raphson reciprocator 304 may then provide the value of 1/P to the DSM inputs 306. It will be appreciated that the Newton-Raphson reciprocator 304 could be replaced with any circuit capable of performing division or suitable approximations of division, however the Newton-Raphson reciprocator 304 offers various advantages. For instance, the Newton-Raphson reciprocator 304 calculates the reciprocal using mostly static logic because the value of P changes infrequently, and thus consumes relatively little power compared to many other methods and may require less computational time to determine 1/P.

The DSM input 306 may include circuitry capable of performing mathematical operations, such as multiplication. The DSM input 306 receives the reciprocal 1/P from the Newton-Raphson reciprocator 304. The DSM input 306 is configured to calculate the initial values of v and f to provide to the DSM 308. The DSM input 306 may receive a value, V, corresponding to the total number of enabled bit-cells for the variable DEM 108. The DSM input 306 may also receive a value, F, corresponding to the total number of enabled bit-cells for each of the fixed DEMs 110. In some examples, F equals M times the number of active fixed DEMs 110, where M is the bit-width of the fixed DEMs 110. For example, if each fixed DEM 110 has a bit-width of 32, and there are 7 active fixed DEMs 110 out of 10 total fixed DEMs 110, then F=32·7=224. It will be appreciated that not all fixed DEMs 110 need be active at the same time. Accordingly, in some examples, F+V=P. The DSM input 306 may also receive a value corresponding to the digital input signal, for example, the digital input signal's amplitude and polarity. The DSM input 306 then determines the value of v based on the digital input signal, the enabled bit-cells for the variable DEM 108, and the reciprocal 1/P. For example, v may be the value of the reciprocal multiplied by the value of the digital input signal and the number of enabled bit-cells allocated to the variable DEM 108. That is:

$$v = \frac{\text{Digital Input Signal Value}}{P} V$$

where v is the number of active bit-cells for the variable DEM 108, P is the bit-cell population, and V is the number of enabled bit-cells allocated to the variable DEM 108. The number of active bit-cells for the fixed DEMs 110 are determined similarly. It will be appreciated that f corresponds to the number of bit-cells to be activated by each fixed DEM 110, and not the total number of bit-cells to be activated across all fixed DEMs 110. The value off may be determined by multiplying the value of the digital input signal, the reciprocal, and F together. That is:

$$f = \frac{\text{Digital Input Signal Value}}{P} F$$

The DSM input 306 provides f and v to the DSM 308. It will be appreciated that 1/P and the digital input signal value are not necessarily integer values. Accordingly, f and/or v may be fractional. However, bit-cells are integers: that is, each bit-cell is a discrete component that is either on or off. As a result, fractions of bit-cells cannot be activated. If the values off and v were truncated, rounded up, or otherwise adjusted without taking into account the error induced by the fractional remainders of each value, over time the CVBP DEM 100 would experience an error in its output, and the error may potentially grow large and/or audible. The V-DSM corrector 308a corrects the value of v based on the fractional remainder of v. The V-DSM corrector 308a is configured to maintain the integer average of v very close to the ideal value. The V-DSM corrector 308a may do this by adjusting the value of v some of the time. In some examples, the V-DSM corrector 308a may decrease the value of v by 1 if the fractional remainder of v is below a certain value (for example, 0.25) and may increase the value of v by 1 if the fractional remainder of v is above a certain value (for example 0.75). In some examples, the V-DSM corrector 308a may only adjust the value of v half of the time, even if v's fractional remainder meets the adjustment condition (for example, being less than 0.25 and/or greater than 0.75). As a result, in some examples, the average value of v over time approaches approximately one-half less than the ideal value for v (i.e. $v_{ideal} - \frac{1}{2}$).

The V-DEM accumulator 308b records values of v and monitors them over time. If the V-DEM accumulator 308b detects that v has been too low and/or is trending to low, the V-DEM accumulator 308b may increase or decrease the value of v by an appropriate amount, for example 1. In the example given above, where v is incremented about half the time when it meets one of the two conditions concerning the fractional remainder, the V-DEM accumulator 308b may adjust the value of v about half the time as well. Once the value of v is known, the value of (f·V−v·F) is stored in the V-DSM accumulator 308b. If v is averaging too high, the V-DEM accumulator 308b may go negative (i.e., vF>fV) and the V-DEM accumulator 308b may increase at least the next value of v so that v will average too low (for example, ½ too low). As mentioned above, this incrementation may occur about half the time due to the averaging process described in the V-DSM corrector 308a.

The effect of the combined operation of the V-DSM corrector 308a and the V-DSM accumulator 308b is to cause, over time, the average integer value of v to approach the ideal value of v. Once v and f are fully adjusted by the V-DSM corrector 308a and V-DEM accumulator 308b, the DSM 308 may round, truncate, or otherwise dispose of the fractional remainder.

The DSM 308 may also be configured such that the value of active bit cells for the fixed DEMs 110 divided by the total number of enabled bit-cells for the fixed DEMs 110 divided by the bit-cell population is equal to the total number of active bit-cells for the variable DEM 108 divided by the enabled bit-cells allocated to the variable DEM 108 divided by the bit-cell population when averaged over a short time span. That is, the DSM 308 may be configured such that:

$$\frac{f}{(F/P)} = \frac{v}{(V/P)}$$

when averaged over a short time span. If this condition is met, any inequality is forced to have a higher frequency than the audio bandwidth. In some examples, this makes potential noise and/or distortion inaudible or filterable without affecting the audio output signal, for instance, by forcing the frequency of the distortion into a frequency not audible to the human ear.

The value off may be further adjusted by a value, for example 0 or 1. This random extra value is applied to a subset of the fixed DEMs 110 to ensure each fixed DEM 110 drives the same number of active bits every clock cycle, which may force any distortion and/or noise above the audio frequency.

It will be appreciated that the adjustment values described herein are arbitrary, and that values could be picked to cause v to average more or less than ½ less than the ideal value, and the accumulator could adjust by more or less than 1 to account for this.

Figure 4A:
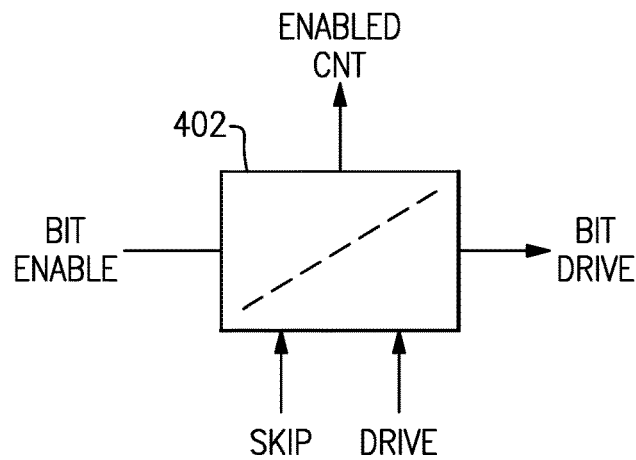
FIG. 4A illustrates a selective bit-enabled barrel shifter according to an example.
Figure 4B:
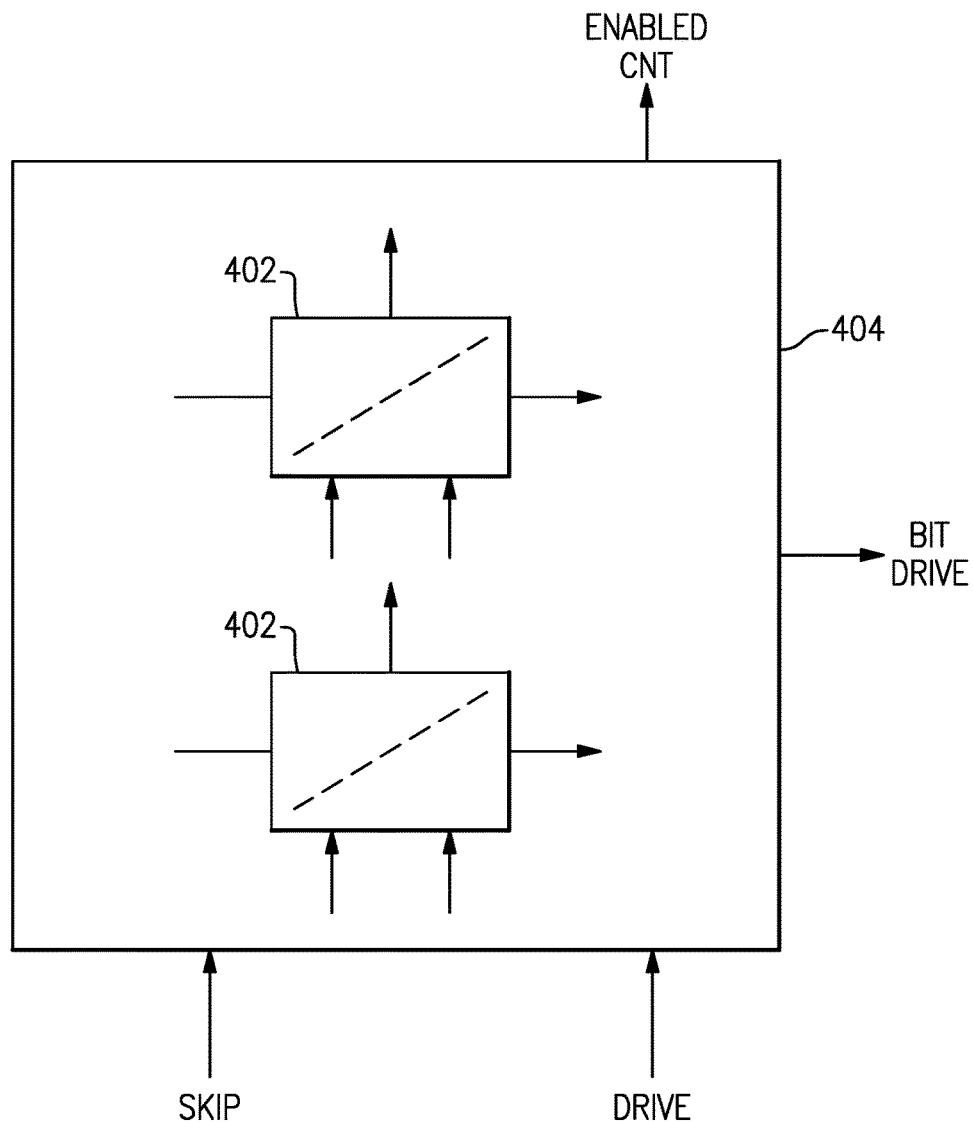
FIG. 4B illustrates an expanded barrel shifter according to an example.

FIG. 4A illustrates a selective bit-enabled barrel shifter (SBBS) 402 that may be combined with other SBBSs 402 to hierarchically construct an SBBS of arbitrary size, as discussed with respect to FIG. 4B. The SBBS 402 may be used by the fixed and variable DEMs (e.g., fixed DEM 110, variable DEM 108) to control which bit-cells are activated and which are not. The SBBS 402 may also be used to ensure that bits and/or bit-cells are evenly used by, for example, ensuring that active bits are deactivated after one clock cycle, as described in greater detail below.

The SBBS 402 includes three inputs, BIT ENABLE, SKIP, and DRIVE, and two outputs, ENABLED CNT and BIT DRIVE. The BIT ENABLE input sets how many bits or bit-cells are enabled (for example, how many bit-cells are part of the bit-cell population). The DRIVE input determines which bits of the enabled bits are activated (for example, which bit-cells from among the bit-cell population are activated). The SKIP input determines if a bit is skipped (that is, not shifted by the SBBS 402). In some examples, no inactive bits are shuffled (that is, all inactive bits are skipped). In some examples, the BIT ENABLE and BIT DRIVE busses may be N bits wide, and the SKIP, DRIVE, and ENABLED CNT busses may be N−1 bits wide. For example, N may equal 3, and N−1 may equal 2.

In operation, the SBBS 402 may be configured such that, starting at index 0 of BIT DRIVE and moving to positions 1, 2, 3, and so forth, any number of non-enabled bits are skipped along with the bits indicated to be skipped by the SKIP input. Such bits have their value set to off (which will be referred to as "0" herein). Skipped bits may not be activated and may not be shuffled. A number of bits equal to the DRIVE input are then turned on (which will be referred to as "1" herein), again skipping any non-enabled bits. Finally, any bits that are enabled, per the BIT ENABLE input, but that would result in more than DRIVE bits being actually driven, are set to 0 as well. The bits set to 1 may be set to 0 on the next clock cycle, ensuring they are not activated for two clock cycles in a row. For example, the bits set to 1 may be selected to be skipped or not enabled on the next clock cycle, and would thus be set to 0.

FIG. 4B illustrates how the SBBS 402 may be hierarchically combined with each other to create larger selective bit-enabled barrel shifters. For clarity, the expanded SBBS of FIG. 4B shall be referred to as the expanded barrel shifter 404. The hierarchal combination of the SBBSs 402 into larger expanded barrel shifter 404 components (which can then be combined with additional expanded barrel shifter 404 components, in a recursive manner to increase the size of expanded barrel shifter 404 to any arbitrary size), allows the expanded barrel shifter 404 to use considerably less logic than implementing a hardware loop to execute the relevant functions. As a result, the expanded barrel shifter 404 may use less power, less space, and fewer logic gates than a hardware loop circuit. In some examples, the depth of the expanded barrel shifter 404 grows at $\log_2(N)$, where N is the bit width of the expanded barrel shifter 404. Furthermore, because the depth of the hierarchical logic of the expanded barrel shifter 404 increases logarithmically compared to the bit-width (that is, the depth, in some examples, is always less than the bit-width), the expanded barrel shifter 404 also offers lower propagation delay compared to hardware loop circuits and other circuits capable of implementing the necessary logic.

Figure 4C:
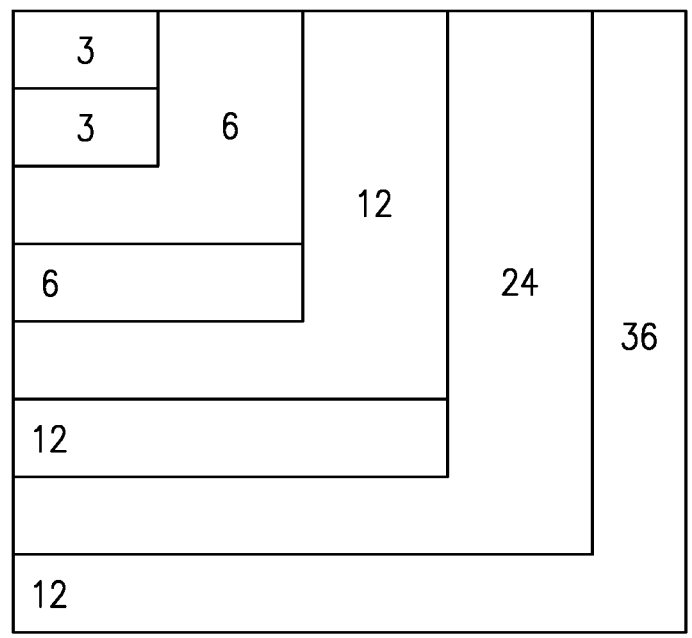
FIG. 4C illustrates a graph of the growth of the expanded barrel shifter of FIG. 4B according to an example.

FIG. 4C illustrates the growth of the expanded barrel shifter at a bit-width of 32-bits. As shown, two 3-bit wide SBBS 402 components are combined to make a 6-bit wide expanded barrel shifter 404. Two 6-bit wide expanded barrel shifters 404 are combined to make a 12-bit expanded barrel shifter 404, two 12-bit wide expanded barrel shifters 404 are combined to make a 24-bit wide expanded barrel shifter 404, and then the 24-bit wide expanded barrel shifter 404 is combined with a 12-bit wide expanded barrel shifter 404 to create a 36-bit wide expanded barrel shifter 404. This expansion logic has a depth of 5, and a bit-width of 32, with 4 extra bits that need not be used for any purpose, but may, in some examples, be put to other uses. It will be noted that the $\log_2(32)$ is 5. It will be appreciated that other combinations are possible (for example combining a 3-bit wide SBBS 402 with a 6-bit wide expanded barrel shifter 404 to create an 8-bit wide expanded barrel shifter 404 with 1 extra bit, and so forth).

FIG. 5 illustrates a variable-width DEM (variable DEM) 500 according to an example. The variable DEM 500 may be suitable for use as the variable DEM 108 of FIG. 1. The variable DEM 500 includes a variable DEM (VDEM) input 502, a decoder 504, a reverse shuffle network 506, a variable DEM (VDEM) array 508, a forward shuffle network 510, and a variable DEM (VDEM) output 512. The decoder 504 may be a thermometer-coded decoder, or any other type of decoder. The VDEM array 508 may be implemented as a barrel shifter of any given width. For example, the SBBS 402 and/or expanded barrel shifter 404 of FIGS. 4A-4C may be used as the VDEM array 508. The variable DEM 500 is configured to determine which bit-cells to activate from among the bit-cell population provided to the variable DEM 500.

The VDEM input 502 is coupled to the decoder 504. The decoder 504 is coupled to the inverse shuffle network 506. The inverse shuffle network 506 is coupled to the decoder 504, the VDEM array 508, and to the forward shuffle network 510. The VDEM array 508 is coupled to the inverse shuffle network 506 and the forward shuffle network 510. The forward shuffle network 510 is coupled to the inverse shuffle network 506, the VDEM array 508, and the VDEM output 512. The operations described with respect to the variable DEM 500 may be executed in a single clock cycle, less than a single clock cycle, or more than a single clock cycle.

The variable DEM 500 receives an input signal at the decoder 504. The input signal may correspond to the bit-cell population calculation of, for example, the BCPC 104. The decoder 504 decodes the input signal and provides it to the reverse shuffle network 506. The reverse shuffle network 506 may have a topology identical to the forward shuffle network 510, but the reverse shuffle network 506 is configured to perform an inverse shuffle on the shuffled output provided by the forward shuffle network 510. For example, if the forward shuffle network 510 receives an original input signal and shuffles the original input signal into a shuffled signal, then the reverse shuffle network 506 can take the shuffled signal and reverse it through an inverse transformation to retrieve the original input signal provided to the forward shuffle network 510. In some examples, the reverse shuffle network 506 is configured to receive an output from the forward shuffle network 510 corresponding to the activated bit-cells. The reverse shuffle network can then inversely transform the output from the forward shuffle network 510 to determine the original input to the VDEM array 508. In this manner, the forward and reverse shuffle networks 510, 506 can ensure that only un-activated bit-cells are activated by the VDEM Array 508—that is, the system can guarantee that no bit-cell is activated for more than a single clock cycle. In other words, the VDEM Array 508 determines which bit-cells to activate based on the state of activated bit-cells one or more clock cycles earlier. The VDEM Array 508 also receives input signals from another circuit component, for example the DSM 106c. The VDEM Array 508 may use the input signals from the DSM 106c to determine which bit-cells to activate. For example, if the VDEM Array 508 is implemented according to the selected bit-enabled barrel shifter of FIGS. 4A-4C, then the input signal from the DSM 106c may be used to provide the DRIVE and SKIP inputs discussed with respect to FIG. 4.

In some examples, the variable DEM's 500 topology may be implemented in the random extra control 110a of the fixed DEM 110, as well as in the variable DEM 108. The random extra control 110a is configured to determine which fixed DEMs 110 (when there are more than one fixed DEMs 110 in the circuit) to use to activate one or more additional bit-cells when the number of activated bit-cells is not an integer multiple of the bit-cells to be activated by the variable DEM 108 and the fixed DEMs 110. The extra bit-cells make up the difference. However, it is preferable that the extra bit-cells be randomly and evenly selected, such that no fixed DEM 110 activates an extra bit-cell for more than one clock cycle and/or such that no extra bit-cell is activated for more than one clock cycle. The random extra control 110a ensures that no extra bit-cell will be on for more than a single clock cycle. The variable DEM 500 is already configured, as described above, to control the number of clock cycles bit-cells are active during, and can guarantee that a given bit-cell remain active for only a single clock cycle. Accordingly, the variable DEM's 500 logic can be configured to control which fixed DEMs 110 may provide an extra bit-cell by selecting from among the fixed DEMs 110 at random, and ensuring that no single fixed DEM 110 is selected to provide an extra bit-cell for more than one clock cycle at a time.

In some examples, no fixed DEM 110 is present in the CVBP DEM 100. In such examples, a single variable-width DEM 500 may be used with a bit-width equal to the bit-width of the CVBP DEM 100. In such cases, the variable-width DEM 500 may shuffle and drive each bit-cell of the CVBP DEM 100. Such an example is one implementation of a fully variable DEM as described herein.

Figure 6:
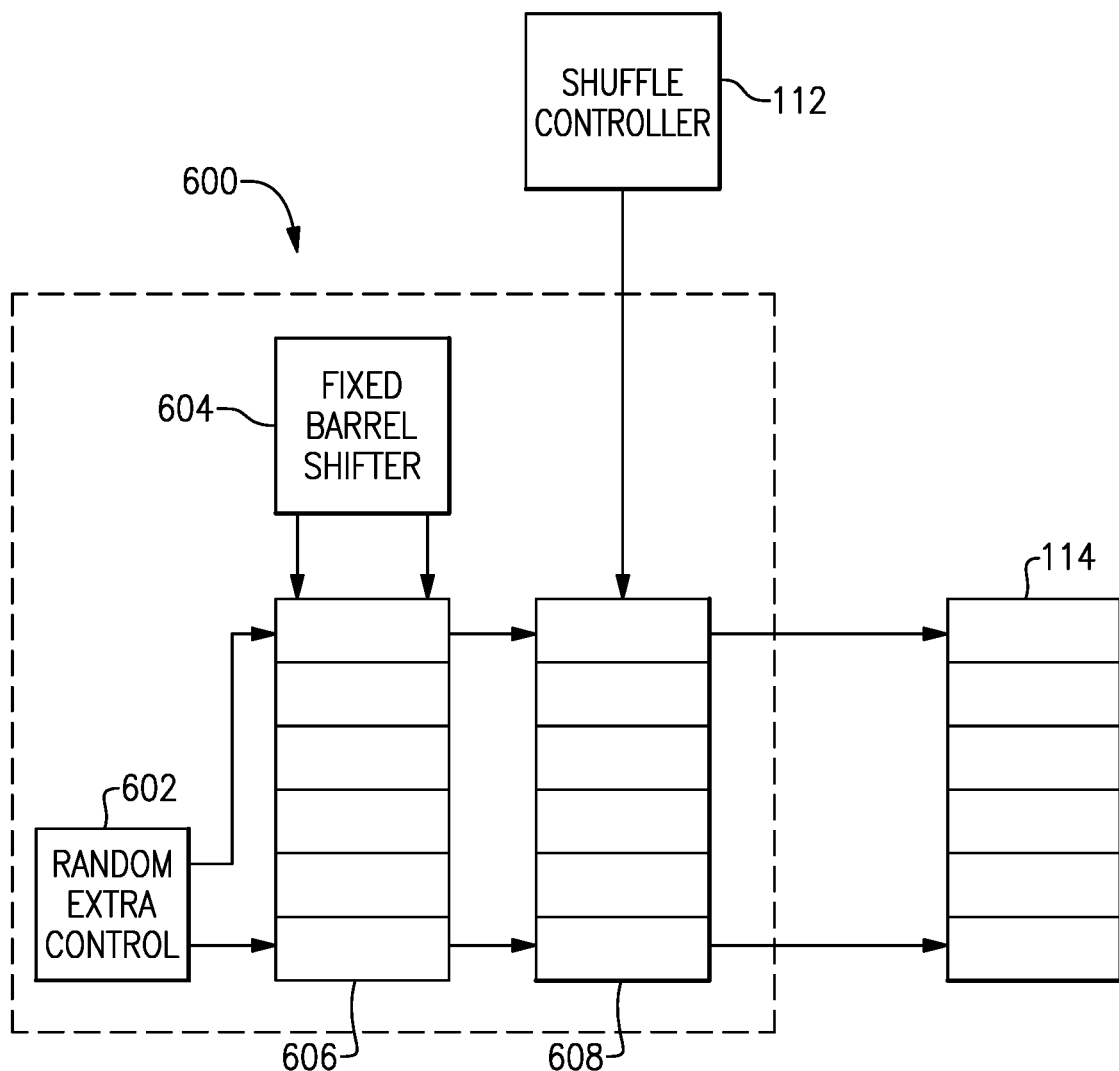
FIG. 6 illustrates a fixed width dynamic element matching network according to a functional block diagram.

FIG. 6 illustrates a block diagram of a fixed width DEM (fixed DEM) 600 according to an example. The fixed DEM 600 may be an example of a fixed DEM suitable for use as fixed DEM 110 in FIG. 1. The fixed DEM 600 includes a random extra control 602, a fixed barrel shifter 604, a barrel shift offset array 606, and a butterfly network 608. Also shown are the shuffle controller 112 and the output array 114.

As shown, the barrel shift offset array 606 and the butterfly network 608 are arrays of elements. In some examples, each element is associated with a unique address. Each element of each array 606, 608 may store relevant data which may be accessed using the unique address associated with that element, or which may be written and/or set by using the unique address associated with that element. The random extra control 602 is coupled to the highest address element of the barrel shift offset array 606 and to the lowest address element of the barrel shift offset array 606. The fixed barrel shifter 604 is coupled to the highest address element of the barrel shift offset array 606 in two places, the first place corresponding to the least significant bits of the element and the second place corresponding to the most significant bits of the element. The most significant bits and least significant bits may be distributed in any contiguous manner. For example, the most significant bits may be the 5 most significant contiguous bits, the 7 most significant contiguous bits, or any other number of most significant continuous bits. The least significant bits may then be the remaining contiguous bits.

The barrel shift offset array 606 is coupled to the butterfly network 608 at the highest address element and the lowest address element. The butterfly network 608 is coupled to the shuffle controller 112. The butterfly network 608 is also coupled to the highest address element and lowest address element of the output array 114.

The CVBP DEM 100 may have one or more fixed DEMs (for example fixed DEMs 110, 600). The number of active fixed DEMs 600 is determined by the bit-cell population. Each fixed DEM 600 has a common bit-width corresponding to the number of bits the fixed DEM 600 can shuffle. For example, a fixed DEM 600 with a bit-width of 32 can shuffle 32 bits each clock cycle. Each fixed DEM 600 drives a subset of bits equal or less than the total bit-width of the fixed DEM 600. In some examples, each active fixed DEM 600 drives a set minimum number of bits. That is, each fixed DEM 600 may drive at least the minimum number of bits. Each fixed DEM 600 may also drive an additional bit, as determined by the random extra control 602. In some examples, the random extra control 602 determines a subset of the fixed DEMs 600 that may drive an additional bit. The random extra control 602 may be implemented using the variable DEM 500 topology as discussed with respect to FIG. 5.

Figure 7:
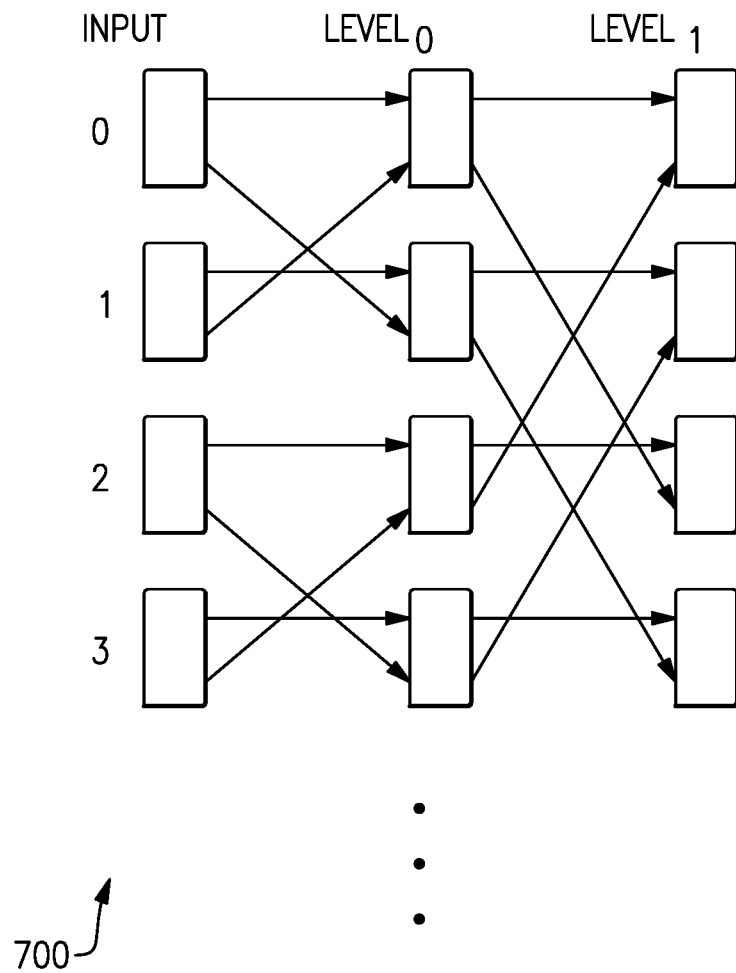
FIG. 7 illustrates a swapping algorithm according to an example.

The barrel shift offset array 606 and the butterfly network 608 are configured to randomize the order of selected bit-cells to reduce tone generated from possible bit-cell mismatch. In some examples, the butterfly network 608 implement an algorithm to swap bit-cells. An algorithm 700 is illustrated in FIG. 7 according to an example. The algorithm 700 may swap only bit-cells selected to be swapped (i.e., enabled bit-cells). The algorithm 700 may perform multiple swaps. For example, at a zeroeth level, the algorithm 700 may swap each adjacent bit-cell based on the index (and/or address) of the bit-cell. At a first level, the algorithm 700 may swap two adjacent bit-cells with two other adjacent bit-cells. At a second level, the algorithm 700 may swap three adjacent bit-cell with three other adjacent bit-cells, and so forth. Other algorithms may also be used, provided the algorithms swap the bit-cells evenly and fairly.

Bit-cells which are not swapped may be powered off, and any logic associated with them may be held constant. It will be appreciated that the random extra control 602 and the fixed barrel shifter 604 need not be implemented as part of the fixed DEM 600. In some examples, only one random extra control 602 and one fixed barrel shifter 604 are required, in which case the one random extra control 602 and one fixed barrel shifter 604 are connected to each of the barrel shift offset arrays 606 of the one or more fixed DEMs 600.

Figure 8:
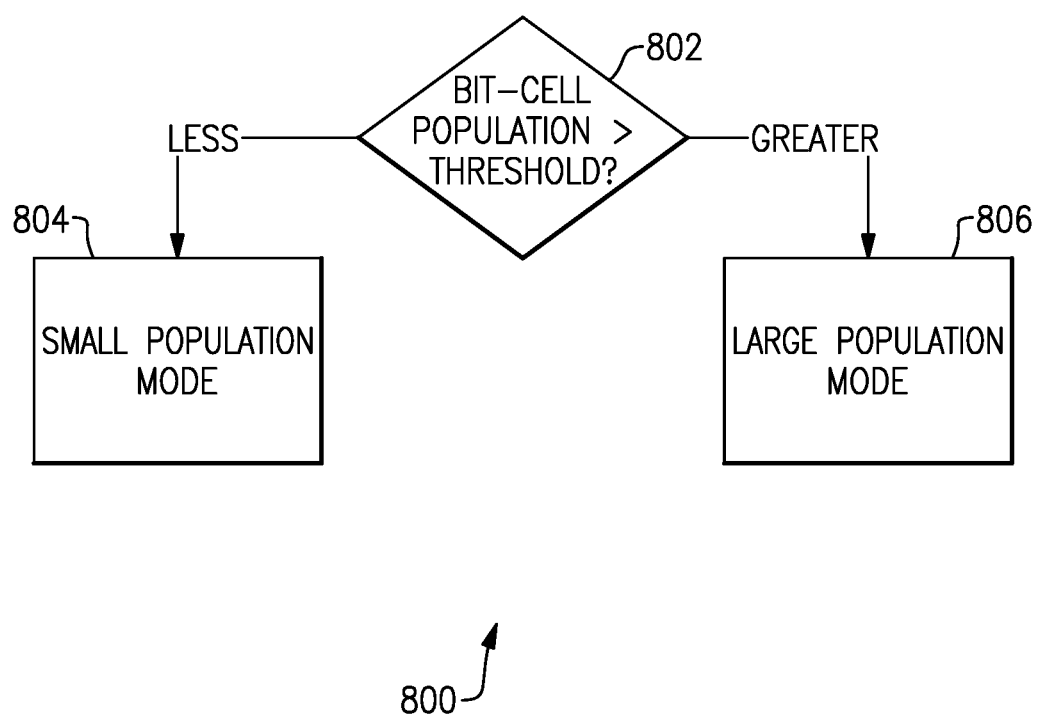
FIG. 8 illustrates a flowchart of a process for determining a large or small population mode of operation.

FIG. 8 illustrates a process 800 of the operation modes of the CVBP DEM 100 according to a functional block diagram. In some examples, the CVBP DEM 100 has a small population mode for when the bit-cell population is below a population threshold, and a large population mode for when the bit-cell population is above a population threshold. It will be appreciated that the population threshold may be set by a user, pre-set or pre-programmed, or determined dynamically by an algorithm.

At act 802, the CVBP DEM 100 determines if the bit-cell population is above and/or below a population threshold. If the bit-cell population is below the threshold (802 LESS) the process 800 continues to act 804 and the CVBP DEM 100 operates in the small population mode. If the bit-cell population is above the threshold (802 GREATER) the process 800 continues to act 806 and the CVBP DEM 100 operates in the large population mode.

In the small population mode, the CVBP DEM 100 may disable the shuffle functionality of the fixed and variable DEMs 108, 110, for example by disabling the forward and reverse shuffle networks 108b, 108d, and disabling the butterfly network 110d. The CVBP DEM 100 may also hold the FVSC 106 static while the bit-cell population is below the population threshold. The CVBP DEM 100 may then shuffle the bit-cells using only barrel shifters, for example the fixed barrel shifter 110b, the variable DEM array 108c, and so forth. It will be appreciated that, in the low population mode, the barrel shifters may ensure sufficient randomness and fairness such that no bit-cell may be active for more than one clock cycle.

In the large population mode, the CVBP DEM 100 is fully active, and no subcomponents (e.g., the shuffle networks 108b, 108d or butterfly network 110d) are disabled. Accordingly, in the large population mode, the CVBP DEM 100 operates with all the functionalities described herein with respect to the other figures.

It will be appreciated that distortion is not limited to audio signals. The present disclosure applies equally to any other electrical signal where predictable error, such as distortion, may occur. Such systems may include power systems (for example power amplifiers), and other systems where signals are converted between digital and analog form.

Various controllers, such as the controller 112, may execute various operations discussed above. Using data stored in associated memory and/or storage, the controller 112 also executes one or more instructions stored on one or more non-transitory computer-readable media, which the controller 112 may include and/or be coupled to, that may result in manipulated data. In some examples, the controller 112 may include one or more processors or other types of controllers. In one example, the controller 112 is or includes at least one processor. In another example, the controller 112 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system for mitigating distortion in a signal comprising:
   a first calculation circuit configured to determine a bit-cell population available to be activated of a plurality of bit-cells based on a signal strength of an input signal;
   a second calculation circuit configured to determine a number of bit-cells to be activated based on the signal strength of the input signal, the number of bit-cells to be activated being less than or equal to the bit-cell population;
   a variable-width dynamic element matching network ("variable DEM") configured to activate a first subset of bit-cells of the bit-cell population based on the number of bit-cells to be activated; and
   one or more fixed-width dynamic element matching networks ("fixed DEMs") configured to activate a second subset of bit-cells of the bit-cell population based on the number of bit-cells to be activated.

2. The system of claim 1 wherein the second calculation circuit determines a first number of bit-cells to be activated by the variable DEM and determines a second number of bit-cells to be activated by each of the one or more fixed DEMs.

3. The system of claim 2 wherein the first subset of bit-cells is based on the first number of bit-cells and the second subset of bit-cells is based on the second number of bit-cells.

4. The system of claim 1 wherein the first subset of bit-cells is activated on a first clock cycle and deactivated on a second clock cycle, and the second subset of bit-cells is activated on the first clock cycle and deactivated on the second clock cycle.

5. The system of claim 4 wherein the first clock cycle is the clock cycle immediately preceding the second clock cycle.

6. The system of claim 4 wherein the variable DEM activates a third subset of bit-cells on the second clock cycle, the third subset of bit-cells not including any bit-cells of the first subset of bit-cells.

7. The system of claim 4 wherein the one or more fixed DEMs activate a third subset of bit-cells on the second clock cycle, the third subset of bit-cells not including any bit-cells of the second subset of bit-cells.

8. The system of claim 1 further comprising a barrel shifter, the system having a low population mode, and a high population mode, wherein
in the low population mode, the barrel shifter is configured to select a subset of bit-cells to be activated based on the number of bit-cells to be activated, and the variable DEM and at least one of the one or more fixed DEMs being deactivated, and
in the high population mode, the barrel shifter is deactivated and the variable DEM and the one or more fixed DEMs are activated.

9. The system of claim 1 wherein the variable DEM includes a first shuffle network, a variable array, and a second shuffle network, and
the first shuffle network is configured to provide a subset of bit-cells to the variable array;
the variable array is configured to provide bit-cells of the bit-cell population not including each bit-cell of the subset of bit-cells to the second shuffle network, and to provide a number of bit-cells to be activated by the variable DEM to the second shuffle network; and
the second shuffle network is configured to randomly select the first subset of bit-cells from among bit-cells of the bit-cell population not including the subset of bit-cells.

10. The system of claim 9 wherein the subset of bit-cells is comprised of bit-cells activated on a first clock cycle immediately preceding a second clock cycle on which the first subset of bit-cells is activated.

11. The system of claim 1 wherein the one or more fixed DEMs include at least one random extra control, at least one fixed barrel shifter, one or more offset arrays, and one or more butterfly networks, and:
the at least one fixed barrel shifter is configured to determine and activate a subset of the one or more fixed DEMs;
the at least one random extra control is configured to select one or more fixed DEM of the subset of fixed DEMs to activate an extra bit-cell based on the number of bit-cells to be activated;
the offset array is configured to randomly select the second subset of bit-cells from among the bit-cells of the bit-cell population; and
the butterfly network is configured to randomize the order of bit-cells selected for the second subset of bit-cells so as to reduce tone generated from bit-cell mismatches.

12. A method of mitigating distortion in a signal comprising:
determining a bit-cell population available to be activated based on a signal strength of a signal;
determining a total number of bit-cells to activate, the total number of bit-cells being less than or equal to the bit-cell population;
responsive to determining the total number of bit-cells to activate, allocating a first portion of the total number of bit-cells, the first portion to be activated by a variable-width dynamic element matching network ("DEM");
responsive to determining the first portion, allocating a second portion of the total number of bit-cells, the second portion to be activated by one or more fixed-width DEMs;
responsive to determining the first portion, randomly selecting a first subset of bit-cells to be activated by the variable-width DEM;
responsive to allocating the second portion, randomly selecting a second subset of bit-cells to be activated by the one or more fixed-width DEMs, the second subset not including any bit-cells of the first subset; and
activating the first subset and second subset of bit-cells.

13. The method of claim 12, bit-cells of the first subset and second subset being activated on a first clock cycle and being deactivated on a second clock cycle.

14. The method of claim 13 wherein the second clock cycle immediately follows the first clock cycle.

15. The method of claim 12 further comprising
determining that the bit-cell population is below a threshold;
responsive to determining that the bit-cell population is below the threshold, determining a subset of bit-cells to be activated by a barrel shifter;
responsive to determining that the bit-cell population is below the threshold, deactivating the variable-width DEM and one or more fixed-width DEMs; and
responsive to determining the subset of bit-cells to be activated by the barrel shifter, activating the subset of bit-cells.

16. The method of claim 12 wherein the bit-cell population is determined periodically.

17. The method of claim 12 wherein the bit-cell population is determined when the signal strength is at or near zero.

18. The method of claim 12 wherein no bit-cell is activated for more than one clock cycle in a row.

19. A system for processing a signal comprising:
a plurality of bit-cells configured to be activated and deactivated;
a calculation circuit configured to determine a first quantity of the plurality of bit-cells to activate during a first clock cycle, the calculation circuit further configured to determine a second quantity of the plurality of bit-cells to activate during a second clock cycle;
a variable dynamic element matching network ("DEM") configured to activate a first subset of bit-cells during the first clock cycle and a second subset of bit-cells during the second clock cycle; and
at least one fixed DEM configured to activate a third subset of bit-cells during the first clock cycle and a fourth subset of bit-cells during the second clock cycle, the first subset, second subset, third subset, and fourth subset each containing only bit-cells that are not present in any other subset.

20. The system of claim 19 wherein:
a first sum of the first subset and second subset equals the first quantity; and
a second sum of the third subset and fourth subset equals the second quantity.

* * * * *

UNITED STATES PATENT AND TRADEMARK OFFICE
CERTIFICATE OF CORRECTION

| | | |
|---|---|---|
| PATENT NO. | : 12,362,731 B2 | Page 1 of 1 |
| APPLICATION NO. | : 18/378439 | |
| DATED | : July 15, 2025 | |
| INVENTOR(S) | : Mark R. Peting | |

It is certified that error appears in the above-identified patent and that said Letters Patent is hereby corrected as shown below:

In the Specification

Column 1, Line 50, delete "Dems" and insert -- DEMs --
Column 13, Line 8, delete "off" and insert -- of $f$ --
Column 13, Line 25, delete "off" and insert -- of $f$ --
Column 13, Line 28, delete "off" and insert -- of $f$ --
Column 14, Line 13, delete "Vis" and insert -- $V$ is --
Column 14, Line 19, delete "off" and insert -- of $f$ --
Column 14, Line 33, delete "off" and insert -- of $f$ --
Column 15, Line 33, delete "off" and insert -- of $f$ --

Signed and Sealed this
Twelfth Day of August, 2025

Coke Morgan Stewart
*Acting Director of the United States Patent and Trademark Office*